(12) United States Patent
Abe et al.

(10) Patent No.: US 9,876,971 B2
(45) Date of Patent: Jan. 23, 2018

(54) SOLID-STATE IMAGING DEVICE

(71) Applicant: Panasonic Intellectual Property Management Co., Ltd., Osaka (JP)

(72) Inventors: Yutaka Abe, Osaka (JP); Kazuko Nishimura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/196,039

(22) Filed: Jun. 29, 2016

(65) Prior Publication Data

US 2016/0309100 A1     Oct. 20, 2016

Related U.S. Application Data

(63) Continuation of application No. PCT/JP2015/000212, filed on Jan. 20, 2015.

(30) Foreign Application Priority Data

Jan. 21, 2014   (JP) ................................. 2014-009024

(51) Int. Cl.
*H01L 27/146* (2006.01)
*H04N 5/357* (2011.01)
(Continued)

(52) U.S. Cl.
CPC ....... *H04N 5/357* (2013.01); *H01L 27/14636* (2013.01); *H01L 27/14641* (2013.01);
(Continued)

(58) Field of Classification Search
None
See application file for complete search history.

(56) References Cited

U.S. PATENT DOCUMENTS 8,259,196 B2 * 9/2012 Yoshikawa .......... H03K 5/2481
348/222.1
2008/0259178 A1   10/2008 Oike
(Continued)

FOREIGN PATENT DOCUMENTS

| JP | 2008-271279 | 11/2008 |
|----|-------------|---------|
| JP | 2013-146045 | 7/2013  |
| JP | 2013-168880 | 8/2013  |

OTHER PUBLICATIONS

International Search Report of PCT application No. PCT/JP2015/000212 dated Mar. 24, 2015.

*Primary Examiner* — Mark T Monk
(74) *Attorney, Agent, or Firm* — McDermott Will & Emery LLP

(57) ABSTRACT

The solid-state imaging device includes unit cells each of which and generates a pixel signal corresponding to a light reception amount, vertical signal lines each of which is provided for a corresponding column of the unit cells and transfers the corresponding pixel signal, comparators each of which is provided for corresponding one of the vertical signal lines, and a ramp signal generation circuit that supplies a common ramp signal to the comparators. Each of the comparators includes a differential amplifier circuit that includes a transistor to which the ramp signal or the pixel signal is input, a transistor to which the other of the ramp signal and the pixel signal is input, an output terminal for outputting a signal corresponding to a difference between the ramp signal and the pixel signal, and a voltage generation circuit for reducing fluctuations of charge accumulated in a capacitance component of the transistor.

8 Claims, 11 Drawing Sheets

(51) Int. Cl.
  *H04N 5/374* (2011.01)
  *H04N 5/378* (2011.01)
  *H04N 5/363* (2011.01)
(52) U.S. Cl.
  CPC ....... *H01L 27/14643* (2013.01); *H04N 5/363* (2013.01); *H04N 5/374* (2013.01); *H04N 5/378* (2013.01)

(56) References Cited

U.S. PATENT DOCUMENTS

2013/0154705 A1 6/2013 Sakurai et al.
2013/0215302 A1 8/2013 Ueno

* cited by examiner

SOLID-STATE IMAGING DEVICE

BACKGROUND

1. Technical Field

The present disclosure relates to a solid-state imaging device.

2. Description of the Related Art

A solid-state imaging device constituted by an MOS (Metal Oxide Semiconductor) image sensor has been known (see PTL 1). An MOS image sensor described in PTL 1 is hereinafter described with reference to FIG. 12.

FIG. 12 is a view illustrating a configuration of a conventional solid-state imaging device (MOS image sensor) described in PTL 1.

Conventional solid-state imaging device 400 illustrated in FIG. 12 includes pixel array unit 410, row selection circuit 420, horizontal transfer scanning circuit 430, timing control circuit 440, ADC (Analog-Digital Converter) group 450, ramp signal generator 460, amplifier circuit 470, signal processing circuit 480, and horizontal transfer line 490. ADC group 450 includes a plurality of single slope AD conversion circuits each of which contains comparator 451, counter 452, and latch circuit 453. Each of the single slope AD conversion circuits is provided for corresponding one of a plurality of vertical signal lines 454.

Pixel array unit 410 contains unit cells in matrix. Each of the unit cells contains a photoelectric conversion element and a unit-cell amplifier.

Timing control circuit 440, row selection circuit 420, and horizontal transfer scanning circuit 430 are control circuits provided to sequentially read pixel signals from pixel array unit 410. Signals corresponding to rows selected by row selection circuit 420 are collectively output to ADC group 450, where the signals generated as analog signals are converted into digital signals by ADC group 450 to generate digital data. The generated digital data is sequentially read by horizontal transfer scanning circuit 430 in the order of selection of columns to read all of pixel signals from pixel array unit 410. Timing control circuit 440 controls row selection circuit 420 and horizontal transfer scanning circuit 430 such that pixel signals can be sequentially read from pixel array unit 410.

ADC group 450 performs analog-digital conversion of pixel signals in a following manner.

Initially, comparator 451 executes comparison between reference voltage Vslope having a ramp waveform, which is a voltage generated by ramp signal generator 460 and varied stepwise with time, and a pixel signal obtained from the unit cell via vertical signal line 454. Counter 452 counts a comparison time of comparator 451. A counted result is output to latch circuit 453. A latched signal is output from amplifier circuit 470 via horizontal transfer line 490. Analog-digital conversion for a pixel signal is performed in this manner at ADC group 450.

According to the foregoing conventional solid-state imaging device, each of the comparators provided in the corresponding column compares a pixel signal in the corresponding column with a ramp signal (reference voltage Vslope) common to all the columns to perform collective analog-digital conversion for all the columns. When the ramp signal common to all the columns fluctuates by operation of the comparator in a certain column, this fluctuation is transmitted to the comparators in other columns. In this case, errors may be produced in the analog-digital conversion result.

For example, different analog-digital conversion results may be obtained in an area containing a bright portion and in an area not containing a bright portion for an identical input signal. This condition deteriorates image quality. In the following description, this phenomenon is referred to as streaking.

CITATION LIST

Patent Literature

PTL 1: Unexamined Japanese Patent Publication No. 2013-168880

SUMMARY

In consideration of the aforementioned problems, an object of the present disclosure is to provide a solid-state imaging device capable of reducing streaking.

For solving the aforementioned problems, a solid-state imaging device according to an aspect of the present disclosure includes: a plurality of unit cells each of which is two-dimensionally disposed, and generates a pixel signal corresponding to a light reception amount; a plurality of vertical signal lines each of which is provided for a corresponding column of the plurality of unit cells, and transfers the corresponding pixel signal; a plurality of comparators each of which is provided for corresponding one of the plurality of vertical signal lines; and a ramp signal supply circuit that supplies a common ramp signal to the plurality of comparators. Each of the plurality of comparators includes a first differential amplifier circuit that includes a first transistor to which one of the ramp signal and the pixel signal is input through a gate of the first transistor, a second transistor to which the other of the ramp signal and the pixel signal is input through a gate of the second transistor, and an output terminal connected with a drain or a source of the second transistor, and outputting a signal corresponding to a difference between the ramp signal and the pixel signal. Each of the comparators further includes a reduction circuit for reducing fluctuations of charge accumulated in a capacitance component of the first transistor.

This structure reduces fluctuations of charge of the first transistor by using the reduction circuit. In this case, fluctuations of potential of the ramp signal caused by fluctuations of charge decrease at the time of input of the ramp signal to the first transistor. Accordingly, fluctuations of the ramp signal commonalized for the respective columns can decrease. Therefore, reduction of streaking is realizable.

The solid-state imaging device according to the present disclosure achieves reduction of streaking.

Figure 1:
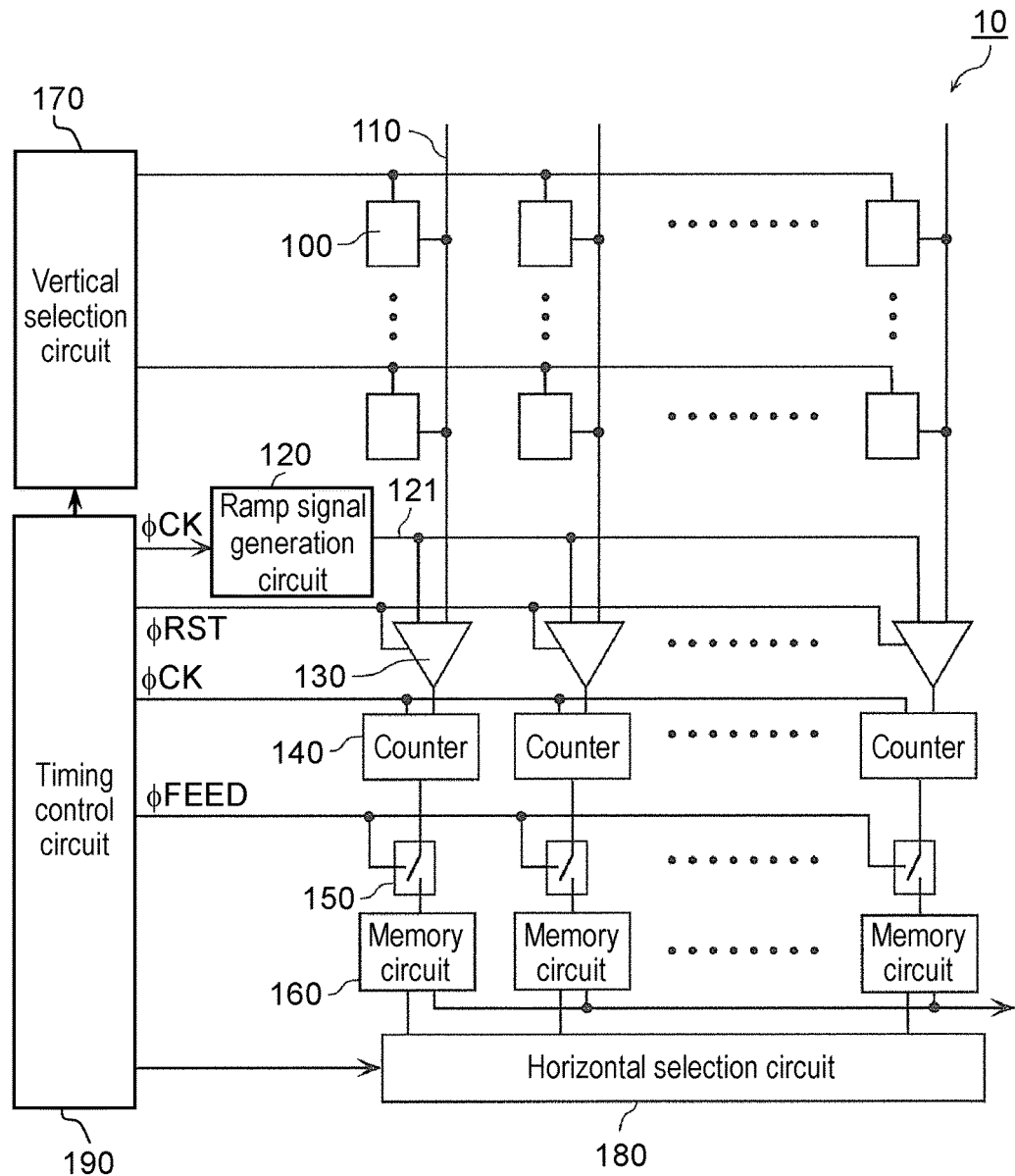
FIG. 1 is a view illustrating an example of a configuration of a solid-state imaging device according to a first exemplary embodiment.

DETAILED DESCRIPTION (Findings on which the Present Disclosure is Based)

The present inventors have found that following problems are arising from the conventional solid-state imaging device described in the section of "Description of the Related Art".

Use of a not-commonalized ramp signal is considered as a possible method for reducing streaking discussed above and avoiding image quality deterioration. However, a circuit for generating a ramp signal is a large-scale component, and thus it is difficult to provide the same number of ramp signal generation circuits as the number of columns on one chip due to limitation of a circuit area.

Another possible method for reducing streaking is to provide a buffer circuit, such as a source follower circuit, on an input portion of each comparator. In this case, however, random noise generated from the buffer circuit may deteriorate image quality.

Under these circumstances, there has been a demand for a solid-state imaging device capable of reducing streaking while preventing generation of random noise.

For meeting this demand, a solid-state imaging device according to the present disclosure includes: a plurality of unit cells each of which is two-dimensionally disposed, and generates a pixel signal corresponding to a light reception amount; a plurality of vertical signal lines each of which is provided for a corresponding column of the plurality of unit cells, and transfers the corresponding pixel signal; a plurality of comparators each of which is provided for corresponding one of the plurality of vertical signal lines; and a ramp signal supply circuit that supplies a common ramp signal to the plurality of comparators. Each of the plurality of comparators includes a first differential amplifier circuit that includes a first transistor to which one of the ramp signal and the pixel signal is input through a gate of the first transistor, a second transistor to which the other of the ramp signal and the pixel signal is input through a gate of the second transistor, and an output terminal connected with a drain or a source of the second transistor, and outputting a signal corresponding to a difference between the ramp signal and the pixel signal. Each of the comparators further includes a reduction circuit for reducing fluctuations of charge accumulated in a capacitance component of the first transistor.

This structure reduces fluctuations of charge of the first transistor by using the reduction circuit. In this case, fluctuations of potential of the ramp signal caused by fluctuations of charge decrease at the time of input of the ramp signal to the first transistor. Accordingly, fluctuations of the ramp signal commonalized for the respective columns can decrease. Therefore, reduction of streaking is realizable.

Solid-state imaging devices according to respective exemplary embodiments of the present disclosure are hereinafter described in detail with reference to the drawings. The exemplary embodiments described herein are presented only as preferred examples of the present disclosure. Numerical values, shapes, materials, constituent elements, arrangement and connection manners of the constituent elements shown in the following exemplary embodiments are presented only as examples not imposing any limitations to the scope of the present invention. Accordingly, constituent elements not contained in the appended independent claims specifying highest-order concepts of the present invention are only regarded as arbitrary constituent elements.

The figures referred to herein are only schematic illustrations, and therefore do not necessarily provide precise depictions. Substantially similar configurations contained in the respective figures are given similar reference numbers. The same explanation is omitted or simplified.

EXEMPLARY EMBODIMENT

First Exemplary Embodiment

A solid-state imaging device according to a first exemplary embodiment is hereinafter described with reference to the drawings.

FIG. 1 is a view illustrating an example of a configuration of solid-state imaging device 10 according to the first exemplary embodiment.

As illustrated in FIG. 1, solid-state imaging device 10 includes a plurality of unit cells 100, a plurality of vertical signal lines 110, ramp signal generation circuit 120, ramp signal line 121, a plurality of comparators 130, a plurality of counter circuits 140, a plurality of data transfer switches 150, a plurality of memory circuits 160, vertical selection circuit 170, horizontal selection circuit 180, and timing control circuit 190.

The plurality of unit cells 100 is two-dimensionally disposed. For example, the plurality of unit cells 100 is provided such that n unit cells and m unit cells are disposed in a vertical direction and a horizontal direction, respectively, to constitute matrix of n rows×m columns. For example, m is a value ranging from several hundreds to several thousands.

Each of the plurality of unit cells 100 contains a light receiving element (pixel) to generate a pixel signal correspond to a light reception amount. Each of unit cells 100 is connected with one of the plurality of vertical signal lines 110. Pixel signals generated by unit cells 100 are transferred to comparators 130 via vertical signal lines 110 connected with corresponding unit cells 100.

A detailed configuration of each of unit cells 100 is described below with reference to FIG. 2.

Each of the plurality of vertical signal lines 110 is provided for the corresponding column of the plurality of unit cells 100. More specifically, each of vertical signal lines 110 is connected in common to the plurality of corresponding unit cells 100 disposed in a line in a vertical direction. Each of vertical signal lines 110 transfers pixel signals generated from connected unit cells 100 to corresponding comparator 130.

Ramp signal generation circuit 120 is an example of a ramp signal supply circuit which supplies a common ramp signal (reference signal) to the plurality of comparators 130. More specifically, ramp signal generation circuit 120 generates a ramp signal, and supplies the generated ramp signal to the plurality of comparators 130 as a common signal. For example, the ramp signal is a signal of voltage varying stepwise. The ramp signal is supplied to each of the plurality of comparators 130 via common ramp signal line 121 connecting ramp signal generation circuit 120 and the plurality of comparators 130.

The plurality of comparators 130 are provided for the plurality of vertical signal lines 110, respectively. More specifically, each of comparators 130 is provided for the corresponding column and connected with corresponding vertical signal line 110. Each of comparators 130 outputs an output signal corresponding to a difference between a pixel signal and a ramp signal.

More specifically, each of the plurality of comparators 130 includes two input terminals and one output terminal. One of the two input terminals is connected with ramp signal line 121 to receive a ramp signal. The other of the two input terminals is connected with corresponding vertical signal line 110 to receive a pixel signal. The one output terminal is connected with counter circuit 140 to output an output signal to counter circuit 140.

A detailed configuration of comparators 130 is described below with reference to FIGS. 3 to 5.

Each of the plurality of counter circuits 140 is provided for each of the plurality of comparators 130, respectively. More specifically, each of counter circuits 140 is provided for the corresponding column, and connected with the output terminal of corresponding comparator 130. Each of counter circuits 140 generates a count value indicating an output signal output from corresponding comparator 130. More specifically, each of counter circuits 140 counts a period of comparison between a ramp signal and a pixel signal, and generates a count value (digital value) indicating this period.

Each of the plurality of data transfer switches 150 is provided for each of the plurality of counter circuits 140, respectively. More specifically, each of data transfer switches 150 is constituted by a MOS transistor, and disposed between corresponding counter circuit 140 and corresponding memory circuit 160 to control transfer of a count value from corresponding counter circuit 140 to corresponding memory circuit 160.

Each of the plurality of memory circuits 160 is provided for the plurality of counter circuits 140, respectively. More specifically, each of memory circuits 160 is provided for the corresponding column, and connected with corresponding counter circuit 140 via corresponding data transfer switch 150. Each of memory circuits 160 retains a count value generated from corresponding counter circuit 140.

Comparators 130, counter circuits 140, data transfer switches 150, and memory circuits 160 constitute an AD conversion unit of solid-state imaging device 10. Analog pixel signals generated from unit cells 100 are converted into digital signals by comparators 130, counter circuits 140, data transfer switches 150, and memory circuits 160.

Vertical selection circuit (row selection circuit) 170 controls the plurality of unit cells 100. More specifically, vertical selection circuit 170 controls timing for reading (transferring) pixel signals from the plurality of unit cells 100.

Horizontal selection circuit (horizontal scanning circuit) 180 controls the plurality of memory circuits 160. More specifically, vertical selection circuit 180 controls timing for reading count values (digital signals corresponding to pixel signals) from the plurality of memory circuits 160.

Timing control circuit 190 controls operation timing of solid-state imaging device 10. More specifically, timing control circuit 190 controls operation timing of ramp signal generation circuit 120, comparators 130, counter circuits 140, data transfer switches 150, vertical selection circuit 170, and horizontal selection circuit 180. Specific operation timing is detailed below with reference to FIG. 6.

The configuration of unit cells 100 according to this exemplary embodiment is hereinafter described with reference to FIG. 2. FIG. 2 is a view illustrating an example of a circuit configuration of the unit cells according to the first exemplary embodiment.

Figure 2:
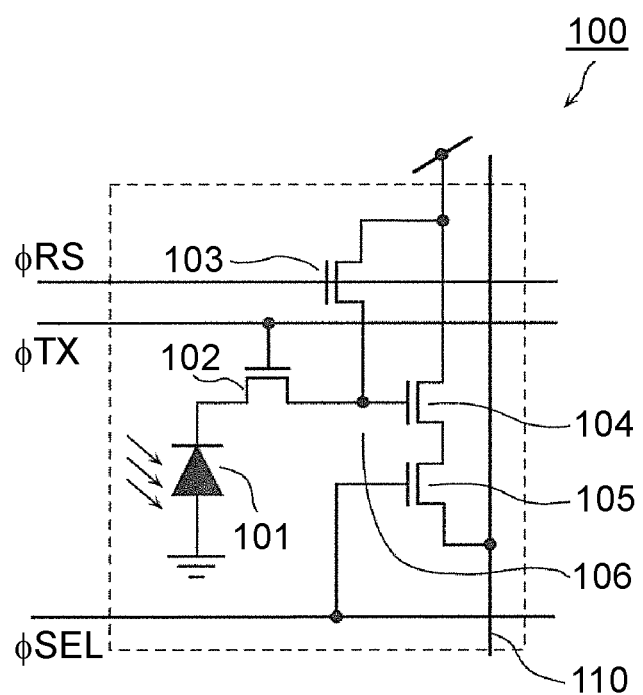
FIG. 2 is a view illustrating an example of a circuit configuration of a unit cell according to the first exemplary embodiment.

As illustrated in FIG. 2, each of unit cells 100 includes photodiode 101, transfer transistor 102, reset transistor 103, reading transistor 104, selection transistor 105, and floating diffusion portion 106. Transfer transistor 102, reset transistor 103, reading transistor 104, and selection transistor 105 function as control transistors for each of unit cells 100.

Photodiode 101 is a light receiving element (photoelectric conversion element) which converts light received from a subject into an amount of electric charge, functioning as a basic constituent element of a pixel (light receiving part). Potential of an anode of photodiode 101 is set to ground potential, and a cathode of photodiode 101 is connected with a source of transfer transistor 102.

Transfer transistor 102 is a transistor provided for transferring charge generated by photodiode 101 to floating diffusion portion 106. A drain of transfer transistor 102 is connected with floating diffusion portion 106, and a gate of transfer transistor 102 is connected with a transfer signal line (φTX).

Reset transistor 103 is a transistor provided for resetting (initializing) potential of floating diffusion portion 106. A source of reset transistor 103 is connected with floating diffusion portion 106, a drain of reset transistor 103 is connected with a power supply line, and a gate of reset transistor 103 is connected with reset signal line (φRS).

Reading transistor 104 is a transistor provided for reading signal potential of floating diffusion portion 106. More specifically, reading transistor 104 outputs a pixel signal correspond to signal potential of floating diffusion portion 106 to vertical signal line 110 via selection transistor 105. A source of reading transistor 104 is connected with a drain of selection transistor 105, a drain of reading transistor 104 is connected with the power supply line, and a gate of reading transistor 104 is connected with floating diffusion portion 106.

Selection transistor 105 is a transistor provided for outputting a pixel signal to vertical signal line 110. A source of selection transistor 105 is connected with vertical signal line 110, and a gate of selection transistor 105 is connected with a selection signal line (φSEL).

Floating diffusion portion 106 receives signal charge generated and transferred from photodiode 101, and temporarily retains the transferred signal charge. Floating diffusion portion 106 generates signal potential correspond to charge generated by photodiode 101.

Operation of each unit cell 100 is now briefly described.

Initially, reset transistor 103 is turned on to reset potential of floating diffusion portion 106. Reset transistor 103 is turned off after the reset. Transfer transistor 102 is subsequently turned on to transfer charge generated by photodiode 101 to floating diffusion portion 106. Selection transistor 105 is further turned on to output a pixel signal corresponding to signal potential of floating diffusion portion 106 to vertical signal line 110 via reading transistor 104 and selection transistor 105. The transistors are turned on and off in accordance with predetermined signals applied to transfer signal line (φTX), reset signal line (φRS), and selection signal line (φSEL) by vertical selection circuit 170.

The configuration of comparators 130 according to this exemplary embodiment is hereinafter described with reference to FIG. 3. FIG. 3 is a view illustrating an example of a circuit configuration of comparator 130 according to the first exemplary embodiment.

Figure 3:
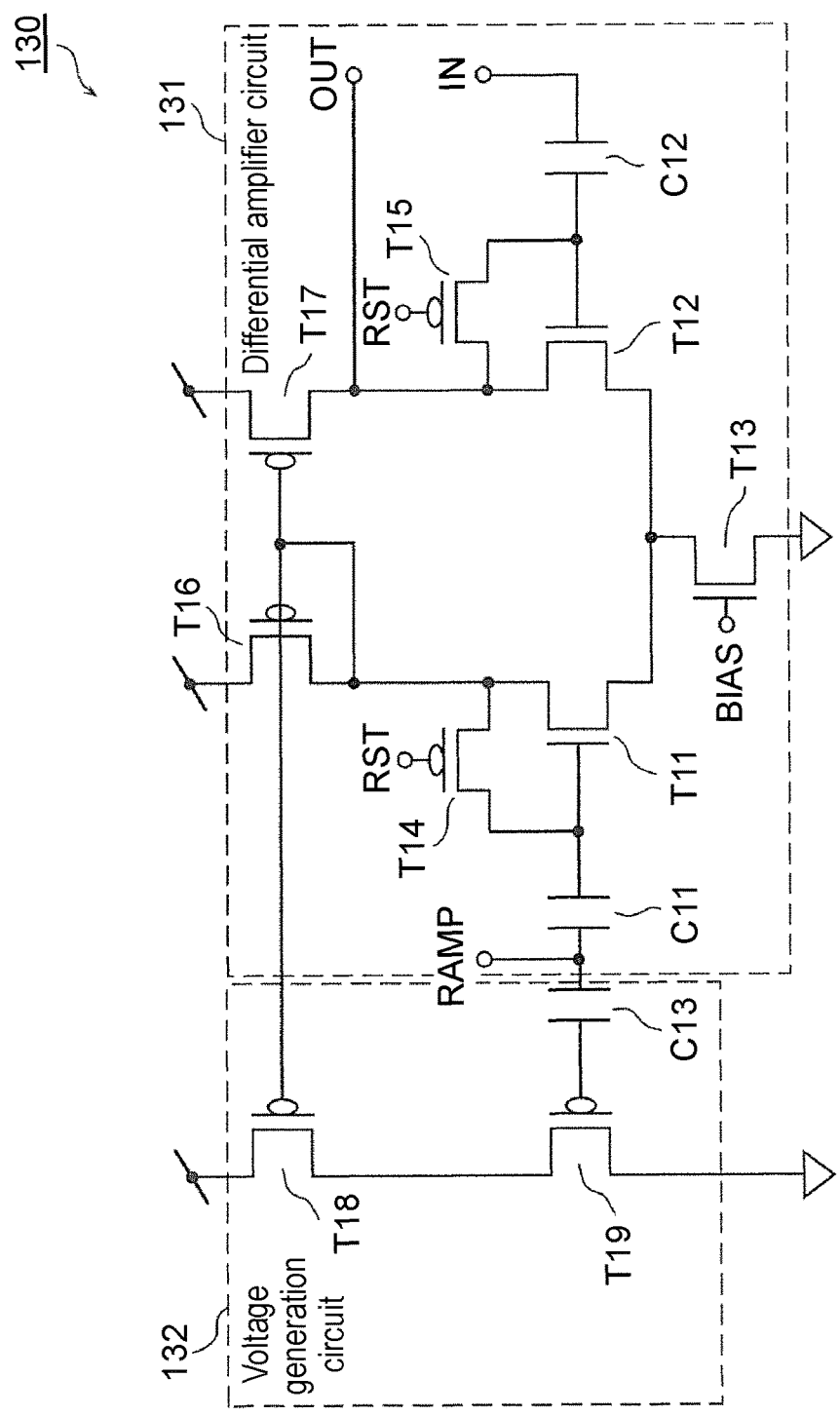
FIG. 3 is a view illustrating an example of a circuit configuration of a comparator according to the first exemplary embodiment.

As illustrated in FIG. 3, comparator 130 includes differential amplifier circuit 131 and voltage generation circuit 132.

Differential amplifier circuit 131 is an example of a first differential amplifier circuit which includes transistor T11 receiving a ramp signal through a gate of transistor T11, transistor T12 receiving a pixel signal through a gate of transistor T12, and an output terminal OUT connected with a drain or a source of transistor T12 and outputting an output signal correspond to a difference between a ramp signal and a pixel signal. More specifically, differential amplifier circuit 131 includes capacitances C11 and C12, transistors T11 and T12 connected with each other via sources of transistors T11 and T12 to constitute a differential pair, transistor T13 constituting a constant current source, transistors T14 and T15 for reset, and transistors T16 and T17 constituting a current mirror circuit.

Capacitance C11 is provided between one of the two input terminals of comparator 130 and the gate of transistor T11. More specifically, one of electrodes of capacitance C11 is connected with first input terminal RAMP to receive a ramp signal. The other electrode of capacitance C11 is connected with the gate of transistor T11.

Capacitance C12 is provided between the other of the two input terminals of comparator 130 and the gate of transistor T12. More specifically, one of electrodes of capacitance C12 is connected with second input terminal IN to receive a pixel signal. The other electrode of capacitance C12 is connected with the gate of transistor T12.

Transistor T11 is an example of a first transistor which receives a ramp signal through the gate of the first transistor. More specifically, a ramp signal is input to the gate of transistor T11 via capacitance C11. Accordingly, the gate of transistor T11 corresponds to one of the two input terminals of comparator 130 (first input terminal).

Transistor T12 is an example of a second transistor which receives a pixel signal through the gate of the second transistor. More specifically, a pixel signal (input analog signal IN) is input to the gate of transistor T12 via capacitance C12. Accordingly, the gate of transistor T12 corresponds to the other of the two input terminals of comparator 130 (second input terminal). On the other hand, the drain of transistor T12 corresponds to the output terminal of comparator 130.

The sources of transistor T11 and transistor T12 are connected with each other. Each of transistors T11 and T12 is constituted by an NMOS transistor, for example.

Transistor T13 functions as a constant current source. Transistor T13 may have a configuration different from the configuration example shown herein, such as a cascode structure, as long as transistor T13 is operable as a constant current source.

A drain of transistor T13 is connected with the sources of transistor T11 and transistor T12 connected with each other.

A predetermined bias voltage is applied to a gate of transistor T13, while potential of a source of transistor T13 is set to ground potential.

Transistor T14 is a transistor provided for resetting (initializing) transistor T11. Transistor T14 is inserted between the gate and the drain of transistor T11. Accordingly, a drain and a source of transistor T14 are connected with the gate and the drain of transistor T11.

Transistor T15 is a transistor provided for resetting (initializing) transistor T12. Transistor T15 is inserted between the gate and the drain of transistor T12. Accordingly, a drain and a source of transistor T15 are connected with the gate and the drain of transistor T12.

Each of transistor T14 and transistor T15 is constituted by a PMOS transistor, for example. Each of transistor T14 and transistor T15 is turned on prior to comparison operation to perform a function of removing variations of comparator 130 in cooperation with capacitance C11 and capacitance C12. Capacitance C11, capacitance C12, transistor T14, and transistor T15 included in comparator 130 may be eliminated.

Transistor T16 and transistor T17 constitute a current mirror circuit. More specifically, a gate and a drain of transistor T16 are connected with each other, and further connected with a gate of transistor T17. The drain of transistor T11 is connected with the drain of transistor T16. A source of transistor T16 is connected with the power supply line.

A drain of transistor T17 is connected with the drain of transistor T12. Accordingly, a node to which the drain of transistor T12 and the drain of transistor T17 are connected corresponds to output terminal OUT. A source of transistor T17 is connected with the power supply line. Each of transistor T16 and transistor T17 is constituted by a PMOS transistor, for example.

Voltage generation circuit 132 is an example of a reduction circuit provided to reduce fluctuations of charge accumulated in a capacitance component of transistor T11. Charge accumulated in the capacitance component of transistor T11 fluctuates in accordance with current flowing in transistor T11, as will be described below. Voltage generation circuit 132 generates voltage, and supplies the generated voltage to the gate of transistor T11 to reduce fluctuations of charge.

More specifically, voltage generation circuit 132 generates voltage in accordance with current flowing in transistor T11, and supplies the generated voltage to the gate of transistor T11. For example, voltage generation circuit 132 is constituted by a source follower circuit. As illustrated in FIG. 3, voltage generation circuit 132 includes capacitance C13, transistor T18, and transistor T19.

Capacitance C13 is provided between one of the two input terminals of comparator 130 and a gate of transistor T19. More specifically, one of electrodes of capacitance C13 is connected with first input terminal RAMP and the gate of transistor T11. The other electrode of capacitance C13 is connected with the gate of transistor T19.

Transistor T18 and transistor T16 constitute a current mirror circuit. More specifically, a gate of transistor T18 is connected with the gate and the drain of transistor T16. A drain of transistor T18 is connected with a source of transistor T19, and a source of transistor T18 is connected with the power supply line.

Transistor T19 and transistor T18 constitute a source follower circuit. A drain of transistor T19 is connected with the ground potential. The gate of transistor T19 is connected with first input terminal RAMP via capacitance C13. Each of transistors T18 and transistor T19 is constituted by a PMOS transistor, for example.

Operation of a comparator including an ordinary differential amplifier circuit is hereinafter described with reference to FIGS. 4 and 5 to clarify an effect of solid-state imaging device 10 according to this exemplary embodiment.

Figure 4:
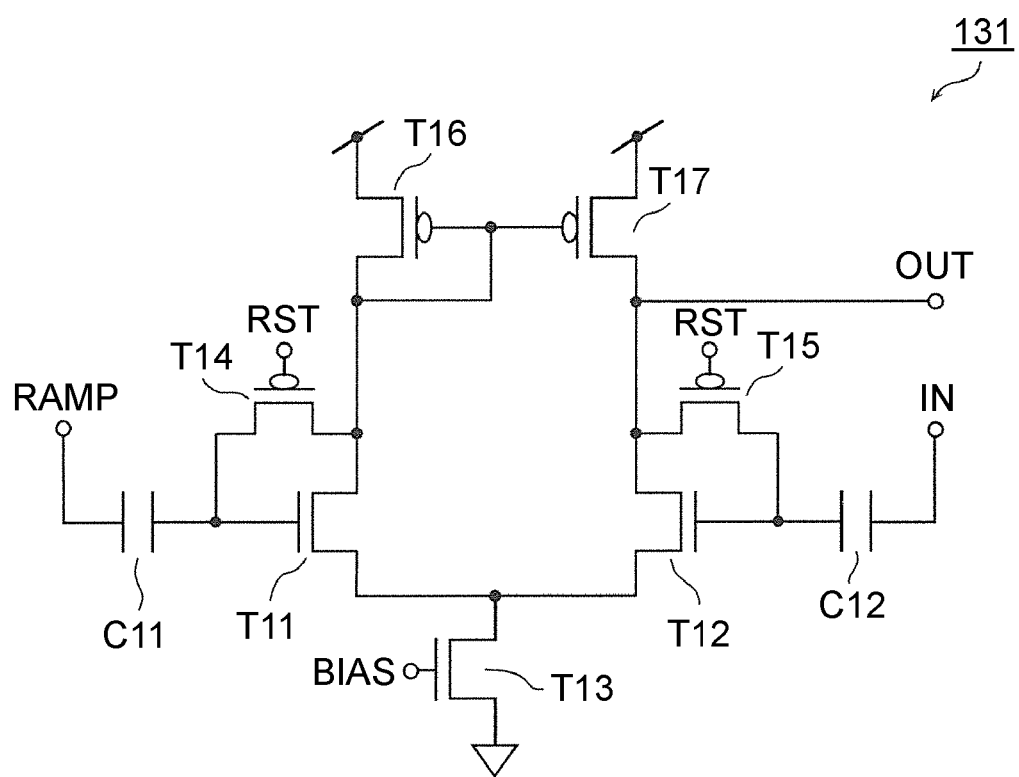
FIG. 4 is a view illustrating a circuit configuration of a comparator included in an ordinary solid-state imaging device.

FIG. 4 is a view illustrating a circuit configuration of a comparator included in an ordinary solid-state imaging device. Elements in FIG. 4 similar to the corresponding elements of comparator 130 illustrated in FIG. 3 are given similar reference numbers.

The ordinary comparator illustrated in FIG. 4 corresponds to differential amplifier circuit 131 illustrated in FIG. 3. More specifically, the comparator illustrated in FIG. 4 corresponds to comparator 130 illustrated in FIG. 3 from which voltage generation circuit 132 is eliminated.

Figure 5:
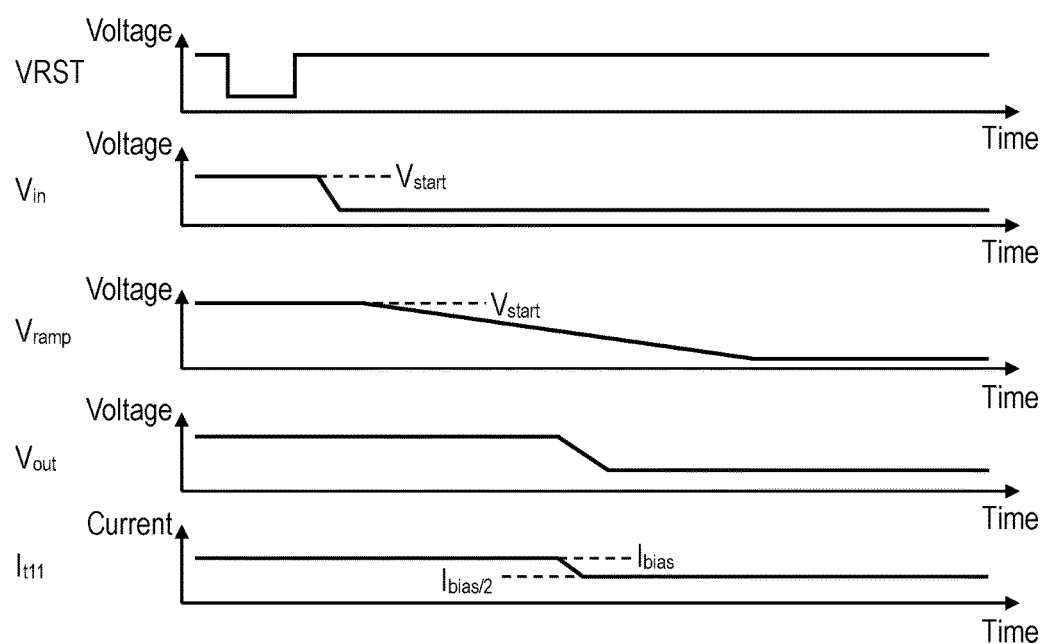
FIG. 5 is a timing chart showing operation of the comparator included in the ordinary solid-state imaging device.

FIG. 5 is a timing chart showing operation of the comparator included in the ordinary solid-state imaging device.

During a reset period, RST potential VRST is set to GND level to turn on transistor T14 and transistor T15. As a result, gate potential of transistor T11 and gate potential of transistor T12 are determined at predetermined potential Vofs (initialized). At this time, each of potential Vramp of first input terminal RAMP and potential Vin of second input terminal IN is at initial potential Vstart.

Subsequently, potential Vin is set to potential of a signal corresponding to a target of analog-digital conversion, i.e., potential of a pixel signal. In this case, gate potential of transistor T12 becomes higher than gate potential of transistor T11, and therefore potential Vout of output terminal OUT rises to power supply level Vdd. Under this state, current does not flow to transistor T12, and therefore all of current Ibias in transistor T13 which is a constant current source flows to transistor T11.

Thereafter, Vramp is linearly varied with time. In this case, potential Vout gradually drops, and current starts flowing to transistor T12. Accordingly, current It11 flowing in transistor T11 decreases. When Vramp is further varied with a drop of Vout, transistor T12 starts operation in a saturated zone. Since then, current flowing in transistor T11 and current flowing in transistor T12 are equalized with each other, and therefore a current value of It11 becomes a half of current Ibias flowing in the constant current source.

Considered herein is voltage Vgs between the gate and the source of transistor T11.

Transistor T11 operates in the saturated zone, and therefore following (Formula 1) holds in a relationship between current Ids flowing between the drain and the source, and voltage Vgs between the gate and the source.

$$I_{ds} = \frac{\beta}{2} \times (V_{gs} - V_{th})^2 \quad \text{[Formula 1]}$$

In this formula, β indicates a transconductor coefficient of transistor T11, and Vth indicates a threshold voltage of transistor T11.

Following (Formula 2) is obtained by deformation of (Formula 1) in consideration that transistor T11 is an NMOS transistor.

$$V_{gs} = \sqrt{2 \times \frac{I_{ds}}{\beta}} + V_{th} \quad \text{[Formula 2]}$$

Charge amount Q accumulated in a gate oxide film capacitance of transistor T11 is expressed by following (Formula 3) based on gate oxide film capacitance value Cgs of transistor T11.

$$Q = C_{gs} \times V_{gs} \quad \text{[Formula 3]}$$

It is understood from (Formula 2) and (Formula 3) that charge amount Q accumulated in the gate oxide film capacitance of transistor T11 varies when the current flowing in transistor T11 changes. When the capacity value of capacitance C11 is sufficiently larger than value Cgs, the capacity value as viewed from first input terminal RAMP is approximated to value Cgs. Accordingly, when current flows from first input terminal RAMP to ramp signal line 121, value Q varies. In this case, potential of the ramp signal fluctuates by an impedance component of ramp signal line 121, and therefore errors occur in an analog-digital conversion result.

According to solid-state imaging device 10 of this exemplary embodiment, however, comparator 130 includes voltage generation circuit 132 as illustrated in FIG. 3. Transistor T16 of differential amplifier circuit 131 and transistor T18 of voltage generation circuit 132 constitute a current mirror circuit. Accordingly, current flowing in transistor T11, i.e., the same current as current flowing in transistor T16 flows in transistor T18 and transistor T19.

Transistor T19 is constituted by a PMOS transistor, and therefore following (Formula 4) holds in a relationship between current Ids2 flowing between the drain and the source and voltage Vgs2 between the gate and the source.

$$I_{ds2} = -\frac{\beta_2}{2} \times (V_{gs2} - V_{th2})^2 \quad \text{[Formula 4]}$$

In this formula, β2 indicates a transconductor coefficient of transistor T19, and Vth2 indicates a threshold voltage of transistor T19.

Following (Formula 5) is obtained by deformation of (Formula 4) in consideration that transistor T19 is a PMOS transistor.

$$V_{gs2} = -\sqrt{2 \times \frac{I_{ds2}}{\beta_2}} + V_{th2} \quad \text{[Formula 5]}$$

In this case, current Ids flowing in transistor T11 is equivalent to current Ids2 flowing in transistor T19, and therefore (Formula 5) is converted into following (Formula 6).

$$V_{gs2} = -\sqrt{2 \times \frac{I_{ds}}{\beta_2}} + V_{th2} = -V_{gs} + V_{th} + V_{th2} \quad \text{[Formula 6]}$$

Charge amount Q2 accumulated in a gate oxide film capacitance of transistor T19 is expressed by following (Formula 7) based on gate oxide film capacitance value Cgs2 of transistor T19, similarly to value Q.

$$Q_2 = C_{gs2} \times V_{gs2} = C_{gs2} \times (-V_{gs} + V_{th} + V_{th2}) = -Q + c \quad \text{[Formula 7]}$$

In this formula, c is expressed by Cgs2×(Vth+Vth2).

According to comparator 130 of this exemplary embodiment, therefore, variations of charge amount Q accumulated in the gate oxide film capacitance of transistor T11 are compensated by variations of charge amount Q2 accumulated in the gate oxide film capacitance of transistor T19. This structure reduces current flowing in ramp signal line 121. Accordingly, errors of the analog-digital conversion result decrease.

In this case, output from the source follower circuit (voltage generation circuit 132) including transistor T18 and transistor T19 does not influence the analog-digital conversion result. Accordingly, random noise does not increase.

When process information is given, a designer is allowed to determine design of β, β2, Cgs, and Cgs2 such that Q=−Q2 holds. In this ideal condition, no error is produced in the analog-digital conversion result. However, errors at least decrease even when a state Q=−Q2 is difficult to hold due to area limitation or power limitation, for example. Accordingly, the effect of solid-state imaging device 10 according to this exemplary embodiment is similarly achievable even in this situation.

Figure 6:
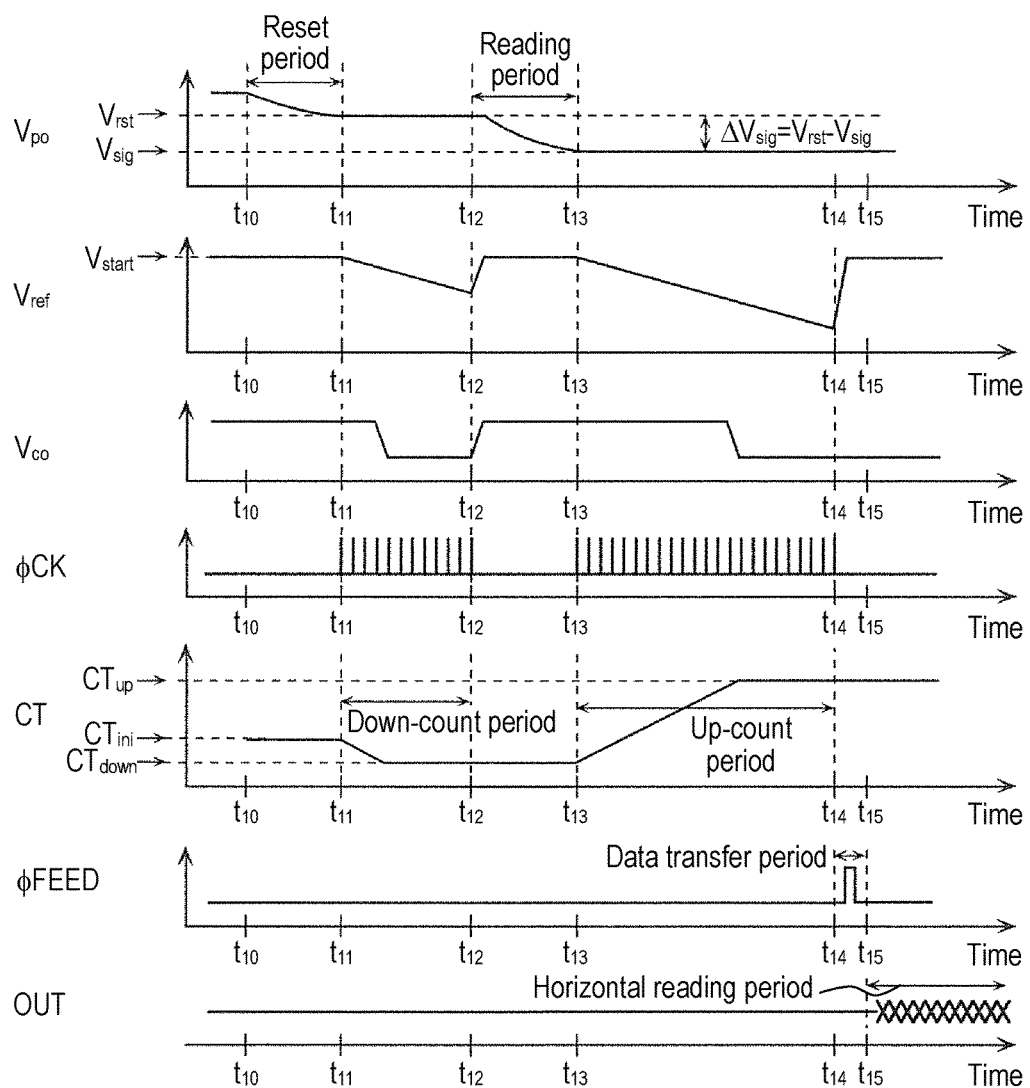
FIG. 6 is a timing chart showing an example of operation of the solid-state imaging device according to the first exemplary embodiment.

Operation of solid-state imaging device 10 according to this exemplary embodiment is hereinafter described with reference to FIG. 6. FIG. 6 is a timing chart showing an example of operation of solid-state imaging device 10 according to the first exemplary embodiment.

In FIG. 6, Vpo indicates potential of vertical signal line 110, i.e., potential of second input terminal IN. In FIG. 6, Vref indicates output potential of ramp signal generation circuit 120, i.e., potential of first input terminal RAMP. In FIG. 6, Vco indicates output potential of comparator 130, i.e., potential of output terminal OUT.

In FIG. 6, φCK indicates a clock signal input to ramp signal generation circuit 120 and counter circuit 140. In FIG. 6, φFEED indicates a pulse signal for controlling data transfer switch 150. Data transfer switch 150 is turned on when φFEED is at a high level ("H" level).

In FIG. 6, CT indicates a count value of counter circuit 140. In FIG. 6, OUT indicates an output value output from memory circuit 160 as a bus signal.

Horizontal axes in FIG. 6 represent time. Vertical axes in FIG. 6 other than a vertical axis of CT represent potential, while the vertical axis of CT represents digital numerical values. Discussed hereinbelow is operation timing for unit cells 100 presented by way of example. This operation is applicable to other types of unit cells.

At time t10, unit cell 100 selected by vertical selection circuit 170 is reset. As a result, potential Vpo of corresponding vertical signal line 110 shifts to reset level Vrst. At time t11, potential Vpo comes into a stable state at Vrst. A period from time t10 to time t11 is referred to as a reset period.

At time t11, clock signal φCK having a predetermined cycle is input to ramp signal generation circuit 120 and counter circuit 140. Potential Vref shifts from initial potential Vstart to low potential in synchronization with clock signal φCK. Similarly, count value CT drops from initial value CTini in synchronization with clock signal φCK.

A level relationship between potential Vpo and potential Vref is reversed at predetermined timing in a period of the shift of potential Vref to low potential. At the time of the reverse, output voltage Vco of comparator 130 changes from the "H" level to a low level ("L" level). As a result, count operation of counter circuit 140 stops.

Thereafter, clock signal φCK stops at time t12, whereby comparison operation also stops. At this time, count value CT is maintained at CTdown corresponding to a value at the time of the reverse of the level relationship between potential Vpo and potential Vref. A period from time t11 to time t12 is referred to as a down-count period.

After completion of down-count operation at time t12, potential Vref returns to initial potential Vstart. In addition, a pixel signal correspond to a light irradiation amount (light reception amount) applied to unit cell 100 selected by vertical selection circuit 170 is output from corresponding unit cell 100 to vertical signal line 110. As a result, reset level Vrst of potential Vpo shifts to signal level Vsig. At time t13, potential Vpo comes into a stable state at Vsig. A period from time t12 to time t13 is referred to as a reading period.

At time t13, clock signal φCK having the predetermined cycle is again input to ramp signal generation circuit 120 and counter circuit 140. Potential Vref shifts from initial potential Vstart to low potential in synchronization with clock signal φCK. Similarly, count value CT rises from value CTdown retained during the down-count period in synchronization with clock signal φCK.

A level relationship between potential Vpo and potential Vref is reversed at predetermined timing in a period of the shift of potential Vref to low potential. At the time of the reverse, output potential Vco of comparator 130 changes from the "H" level to "L" level. As a result, count operation of counter circuit 140 stops.

Thereafter, clock signal φCK stops at time t14, and then comparison operation also stops. At this time, count value CT is maintained at CTup corresponding to a value at the time of the reverse of the level relationship between potential Vpo and potential Vref. A period from time t13 to time t14 is referred to as an up-count period.

After completion of up-count, timing control circuit 190 issues pulse signal φFEED to turn on data transfer switch 150. As a result, count value CTup retained in counter circuit 140 is transferred to memory circuit 160, and retained in memory circuit 160. A period from time t14 to time t15 is referred to as a data transfer period.

Count value CTup retained in memory circuit 160 is output during a period after time t15. Output from memory circuit 160 is controlled by horizontal selection circuit 180. Horizontal selection circuit 180 controls the plurality of memory circuits 160 such that a plurality of count values CTup retained in the plurality of memory circuits 160 can be sequentially read. A period after time t15 is referred to as a horizontal reading period.

Count values CTup retained in memory circuits 160 are sequentially read in the foregoing manner, and output to an amplifier circuit, a signal processing circuit (not shown) and the like disposed downstream.

According to an ordinary solid-state imaging device, several hundreds to several thousands of unit cells 100 are arranged in a horizontal direction. Accordingly, several hundreds to several thousands of comparators 130 are similarly arranged. However, a ramp signal is commonalized to all columns.

In this case, a ramp signal fluctuates along with a change of a charge amount accumulated in a gate oxide film capacitance of a transistor to which the ramp signal is connected in a certain column as described above. As a result, errors occur in an analog-digital conversion result in other columns. Under this state, streaking may be caused.

According to solid-state imaging device 10 of this exemplary embodiment, however, a ramp signal is input to the gate of transistor T11, while a pixel signal is input to the gate of transistor T12. Voltage generation circuit 132 is provided as a reduction circuit which generates voltage corresponds to current flowing in transistor T11, and supplies the generated voltage to the gate of transistor T11.

In this case, a change of a charge amount of the gate oxide film capacitance of transistor T11 is compensated by a change of a charge amount of the gate oxide film capacitance of transistor T19. Accordingly, fluctuations of the ramp signal decrease. This structure therefore reduces errors produced in an analog-digital conversion result of other columns, thereby reducing generation of streaking.

According to the solid-state imaging device of the present disclosure, a ramp signal is input to the gate of the first transistor, and a pixel signal is input to the gate of the second transistor. A reduction circuit may be constituted by a voltage generation circuit which generates voltage corresponding to current flowing in the first transistor, and supplies the generated voltage to the gate of the first transistor.

This structure supplies voltage corresponding to current flowing in the first transistor to the gate of the first transistor, thereby decreasing fluctuations of charge of the first transistor for streaking reduction.

According to solid-state imaging device 10 of this exemplary embodiment, voltage generation circuit 132 is constituted by a source follower circuit.

The configuration of the source follower circuit does not impose great effect on output terminal OUT of differential amplifier circuit 131, thereby reducing a rise of random noise.

According to solid-state imaging device 10 of this exemplary embodiment, each of the plurality of unit cells 100 includes reset transistor 103, transfer transistor 102, reading transistor 104, and selection transistor 105.

This structure appropriately controls reading of pixel signals from unit cells 100.

Second Exemplary Embodiment

A solid-state imaging device according to a second exemplary embodiment is hereinafter described with reference to the drawings. Chiefly discussed hereinbelow are only differences in this exemplary embodiment from the foregoing first exemplary embodiment.

Figure 7:
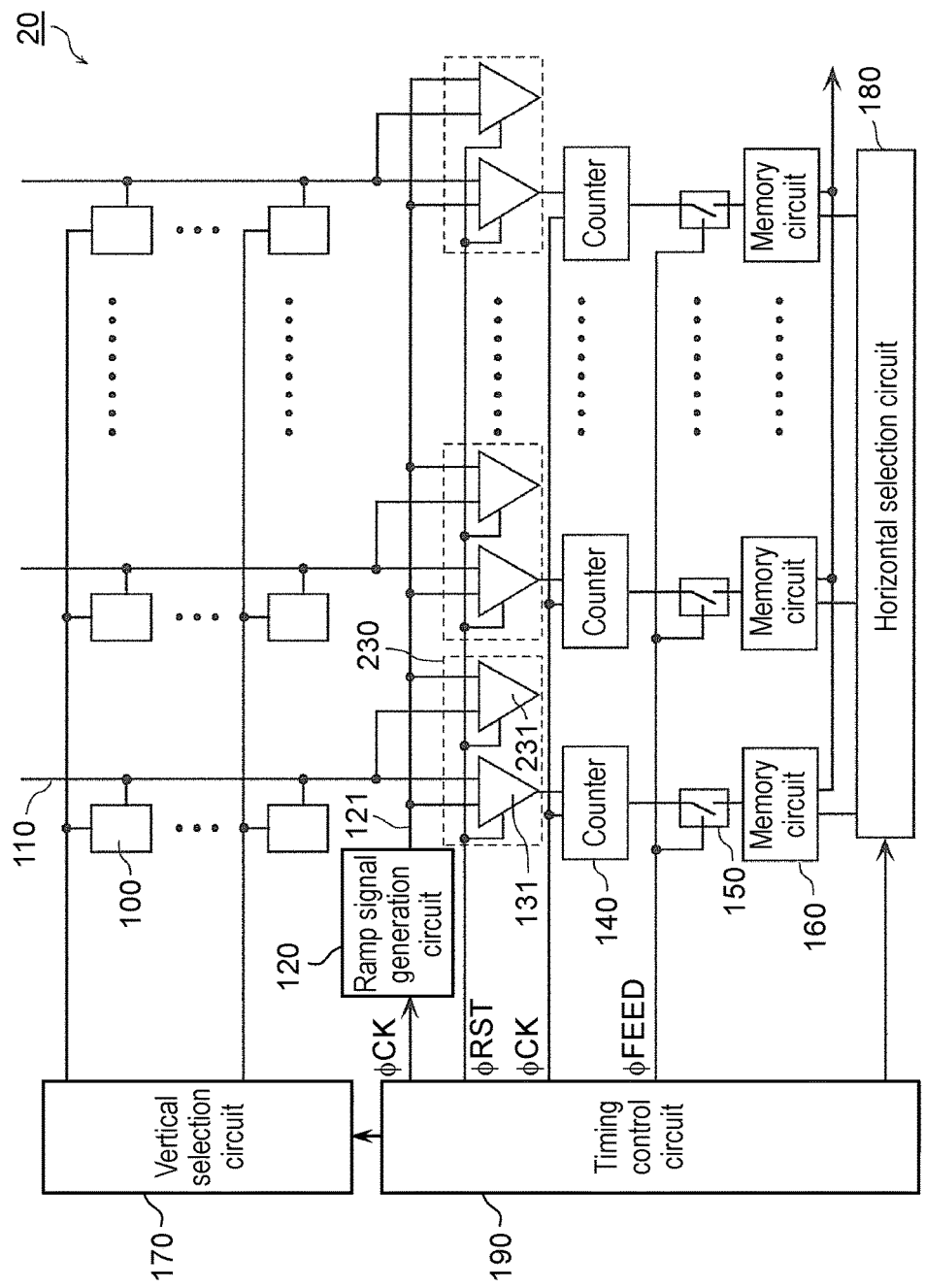
FIG. 7 is a view illustrating an example of a configuration of a solid-state imaging device according to a second exemplary embodiment.

FIG. 7 is a view illustrating an example of a configuration of solid-state imaging device 20 according to the second exemplary embodiment.

Figure 8:
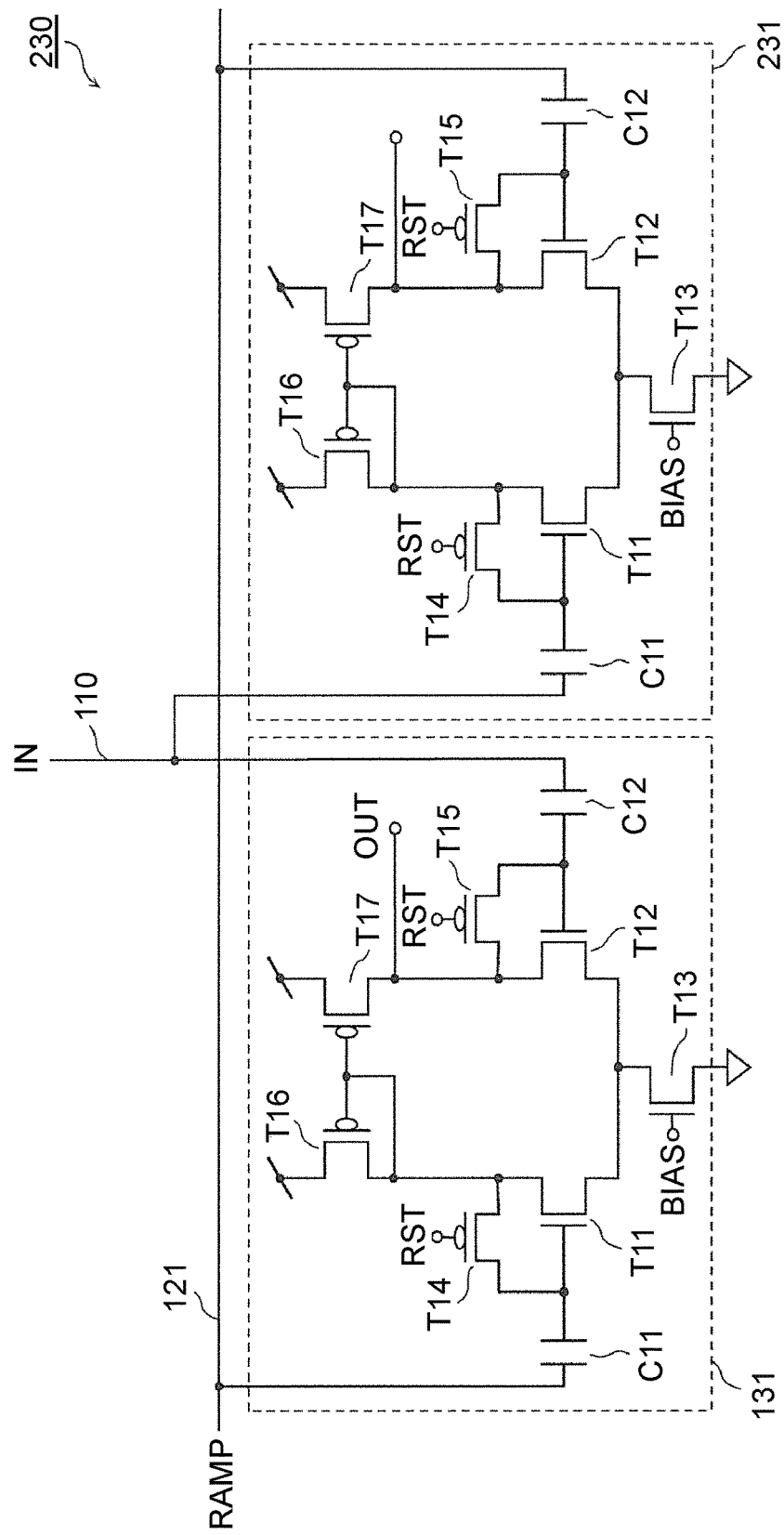
FIG. 8 is a view illustrating an example of a circuit configuration of a comparator according to the second exemplary embodiment.

Solid-state imaging device 20 illustrated in FIG. 7 is different from solid-state imaging device 10 according to the first exemplary embodiment in that a plurality of comparators 230 are provided in place of the plurality of comparators 130. A configuration of comparators 230 is hereinafter described with reference to FIG. 8. FIG. 8 is a view illustrating an example of a circuit configuration of each of comparators 230 according to the second exemplary embodiment.

As illustrated in FIG. 8, each of the plurality of comparators 230 includes differential amplifier circuit 131 and differential amplifier circuit 231.

Differential amplifier circuit 231 is an example of a second differential amplifier circuit having a circuit configuration identical to the circuit configuration of differential amplifier circuit 131. Differential amplifier circuit 231 is an example of a reduction circuit for reducing fluctuations of charge accumulated in the capacitance component of transistor T11 of differential amplifier circuit 131.

As illustrated in FIG. 8, a ramp signal is input to the gate of transistor T11 of differential amplifier circuit 131, and a gate of transistor T12 of differential amplifier circuit 231. Accordingly, ramp signal line 121 is connected with transistor T11 of differential amplifier circuit 131 and transistor T12 of differential amplifier circuit 231 via capacitance C11 of differential amplifier circuit 131 and capacitance C12 of differential amplifier circuit 231, respectively.

A pixel signal is input to the gate of transistor T12 of differential amplifier circuit 131 and a gate of transistor T11 of differential amplifier circuit 231 via capacitance C12 of differential amplifier circuit 131 and capacitance C11 of differential amplifier circuit 231, respectively. Accordingly, vertical signal line 110 is connected with transistor T12 of differential amplifier circuit 131 and transistor T11 of differential amplifier circuit 231.

As described above, differential amplifier circuit 231 having a circuit configuration identical to the circuit configuration of differential amplifier circuit 131 is provided as the reduction circuit of solid-state imaging device 20 according to this exemplary embodiment. A ramp signal is input to the gate of transistor T11 of differential amplifier circuit 131, and to the gate of transistor T12 of differential amplifier circuit 231. A pixel signal is input to the gate of transistor T12 of differential amplifier circuit 131, and to the gate of transistor T11 of differential amplifier circuit 231.

According to this structure, a ramp signal is input to transistor T11 of differential amplifier circuit 131, and changes a charge amount of the gate oxide film capacitance of transistor T11. On the other hand, in differential amplifier circuit 231, this ramp signal is input to transistor T12 which exhibits a change in a manner opposite to the current change of transistor T11.

In this case, the change of the charge amount of the gate oxide film capacitance included in transistor T11 of differential amplifier circuit 131 is cancelled by the change of the charge amount of transistor T12 of differential amplifier circuit 231. As a result, fluctuations of the ramp signal decrease. This structure therefore reduces errors produced in an analog-digital conversion result of other columns, thereby reducing generation of streaking.

According to the solid-state imaging device of the present disclosure, the reduction circuit is constituted by the second differential amplifier circuit having a circuit configuration identical to the circuit configuration of a first differential amplifier circuit. A ramp signal is input to the gate of the first transistor of the first differential amplifier circuit, and to the gate of the second transistor of the second differential amplifier circuit. A pixel signal may be input to the gate of the second transistor of the first differential amplifier circuit, and to the gate of the first transistor of the second differential amplifier circuit.

According to this structure, fluctuations of charge of the first transistor of the first differential amplifier circuit are compensated by fluctuations of charge of the second transistor of the second amplifier circuit operating in the opposite manner. Accordingly, reduction of streaking is achievable.

Third Exemplar Embodiment

A solid-state imaging device according to a third exemplary embodiment is hereinafter described with reference to the drawings. Chiefly discussed hereinbelow are only differences in this exemplary embodiment from the foregoing first exemplary embodiment.

Figure 9:
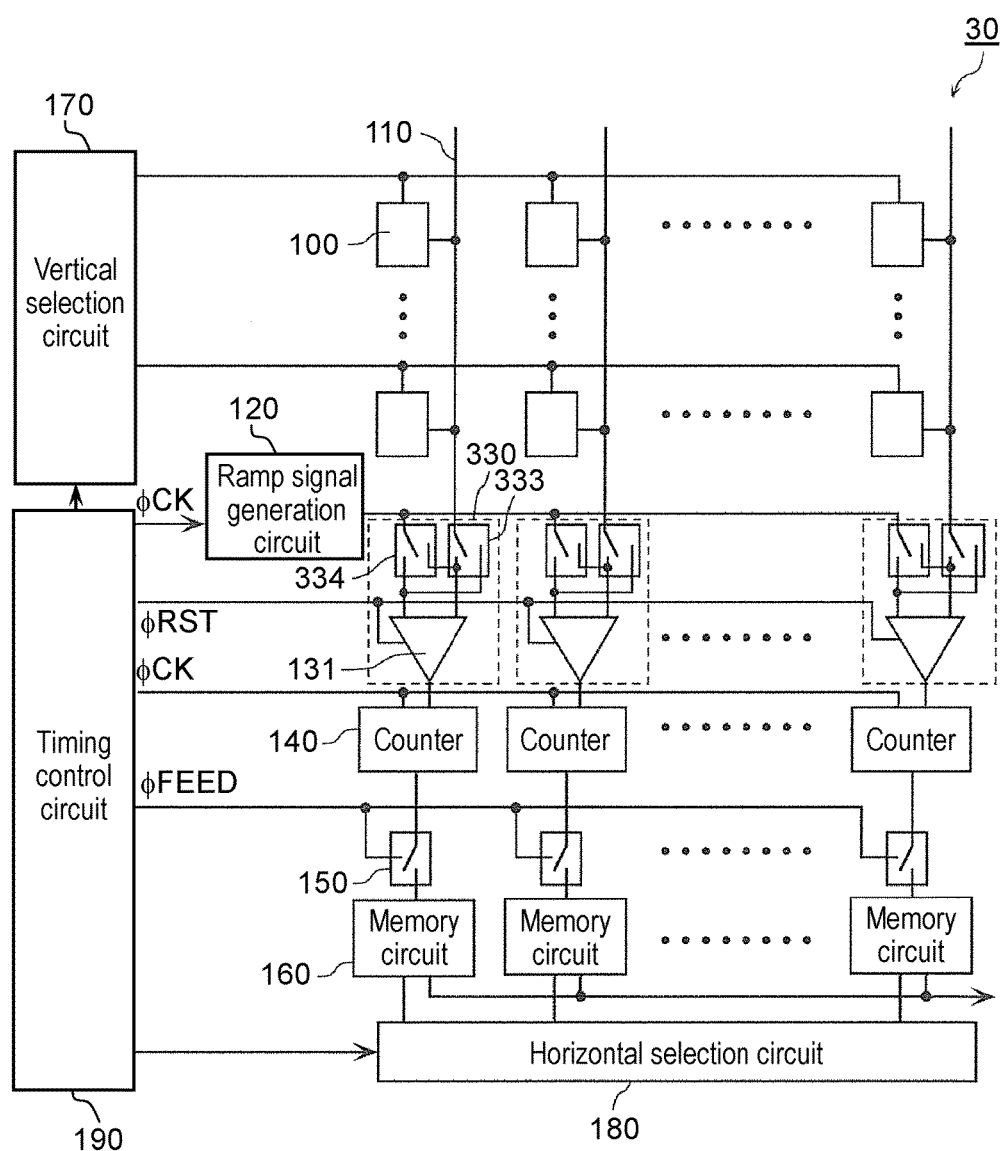
FIG. 9 is a view illustrating an example of a configuration of a solid-state imaging device according to a third exemplary embodiment.

FIG. 9 is a view illustrating an example of a configuration of solid-state imaging device 30 according to the third exemplary embodiment.

As illustrated in FIG. 9, solid-state imaging device 30 is different from solid-state imaging device 10 according to the first exemplary embodiment in that a plurality of comparators 330 are provided in place of the plurality of comparators 130. Each of the plurality of comparators 330 includes differential amplifier circuit 131, first switch 333, and second switch 334. First switch 333 and second switch 334 corresponds to an example of a reduction circuit for reducing fluctuations of charge accumulated in the capacitance component of transistor T11.

First switch 333 is a switch capable of switching an input destination of a pixel signal to either transistor T11 or transistor T12. More specifically, first switch 333 is capable of switching a connection destination of vertical signal line 110 to either a first input terminal to which transistor T11 is connected, or a second input terminal to which transistor T12 is connected.

Second switch 334 is a switch capable of switching an input destination of a ramp signal to the other of transistor T11 and transistor T12. More specifically, second switch 334 is capable of switching a connection destination of ramp signal line 121 to either the first input terminal to which transistor T11 is connected, or the second input terminal to which transistor T12 is connected.

First switch 333 and second switch 334 operate in linkage with each other. More specifically, when first switch 333 connects vertical signal line 110 and the first input terminal, second switch 334 connects ramp signal line 121 and the second input terminal. On the other hand, when first switch 333 connects ramp signal line 121 and the first input terminal, second switch 334 connects ramp signal line 121 and the second input terminal. For example, timing control circuit 190 switches connections made by first switch 333 and second switch 334.

According to the solid-state imaging device of the present disclosure, the reduction circuit may include a first switch capable of switching an input destination of a pixel signal to either the first transistor or the second transistor, and a second switch capable of switching an input destination of a ramp signal to the other of the first transistor and the second transistor.

First switch 333 and second switch 334 may independently operate for each column. For example, in a state that first switch 333 in a first column connects vertical signal line 110 and the first input terminal, first switch 333 in a second column may connect vertical signal line 110 and the second input terminal. On the other hand, in a state that first switch 333 in the first column connects vertical signal line 110 and the first input terminal, first switch 333 in the second column may connect vertical signal line 110 and the first input terminal.

According to solid-state imaging device 30 of this exemplary embodiment, the reduction circuit includes first switch 333 capable of switching an input destination of a pixel signal to either transistor T11 or transistor T12, and second switch 334 capable of switching an input destination of a ramp signal to the other of transistor T11 and transistor T12.

According to this structure, first switch 333 and second switch 334 are provided for each column. Accordingly, solid-state imaging device 30 is allowed to switch between a mode for reading all of unit cell signals with analog-digital conversion, and a mode for reading pixel signals only in a part of columns while reducing streaking by using comparators 330 (differential amplifier circuit 131) provided in columns from which pixel signals are not read.

In this case, each of the first switch and the second switch is capable of determining columns from which pixel signals are read and columns from which pixel signals are not read by switching input destinations of pixel signals and ramp signals. Accordingly, this structure simultaneously achieves reading of pixel signals from only a part of columns, and reduction of streaking by using first differential amplifier circuits provided in columns from which pixel signals are not read.

Modification

The present disclosure is not limited to the solid-state imaging device described in each of the exemplary embodiments presented herein. A technology according to the present disclosure is applicable to other exemplary embodiments realized by an arbitrary combination of constituent elements of the exemplary embodiments described herein, modification containing various modifications readily occurring to those skilled in the art without departing from the scope of the present disclosure, and various types of devices and systems including the solid-state imaging device according to the present disclosure.

For example, each of the plurality of unit cells included in the solid-state imaging devices according to the present disclosure may contain a unit cell control transistor shared between a plurality of adjoining light receiving parts (pixels). More specifically, each of the plurality of unit cells may include a plurality of light receiving elements (photodiodes), and at least one of a reset transistor, a reading transistor, and a selection transistor shared by the plurality of light receiving elements.

Figure 10:
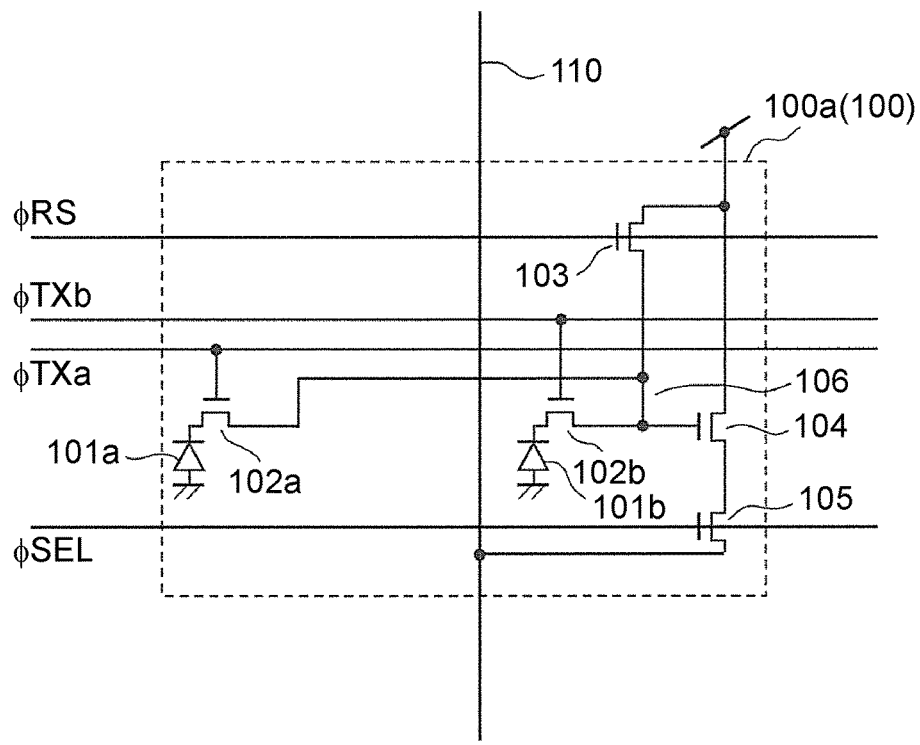
FIG. 10 is a view illustrating an example of a circuit configuration of a unit cell according to a modification of the exemplary embodiments.

FIG. 10 is a view illustrating an example of a circuit configuration of unit cell 100 (unit cell 100a) according to a modification of the exemplary embodiments.

As illustrated in FIG. 10, unit cell 100a includes photodiodes 101a and 101b, transfer transistors 102a and 102b, reset transistor 103, reading transistor 104, selection transistor 105, and floating diffusion portion 106.

As can be understood, photodiodes 101a and 101b of unit cell 100a share reset transistor 103, reading transistor 104, selection transistor 105, and floating diffusion portion 106.

For example, when charge is read from photodiode 101a, transfer transistor 102a is turned on in a high-level state of first transfer signal line (φTXa) to transfer charge to floating diffusion portion 106. On the other hand, when charge is read from photodiode 101b, transfer transistor 102b is turned on in a high-level state of second transfer signal line (φTXb) to transfer charge to floating diffusion portion 106.

As apparent from above, unit cell 100 may have a so-called one-pixel and one-cell structure, i.e., a structure which includes a photodiode (pixel), a transfer transistor, a floating diffusion portion, a reset transistor, an amplifier transistor (reading transistor), and a selection transistor, as described in the exemplary embodiments. Alternatively, a multiple-pixel and one-cell structure is adoptable as in this modification. More specifically, each of the plurality of unit cells 100a of the solid-state imaging device according to this modification may include the plurality of photodiodes 101a and 101b, and at least one of reset transistor 103, reading transistor 104, and selection transistor 105 shared by the plurality of photodiodes 101a and 101b.

According to this multiple-pixel and one-cell structure, a plurality of adjoining light receiving elements share a reset transistor, a reading transistor, and a selection transistor. Accordingly, the practical number of transistors provided for each unit cell decreases.

Figure 11:
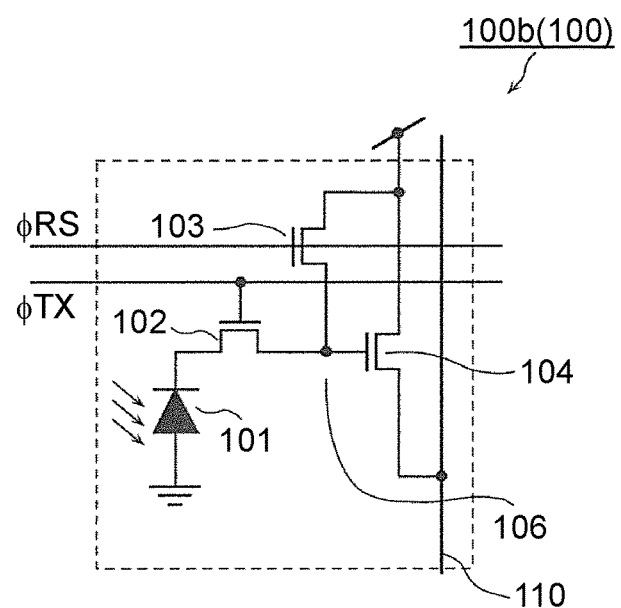
FIG. 11 is a view illustrating another example of a circuit configuration of a unit cell according to a modification of the exemplary embodiments.
Figure 12:
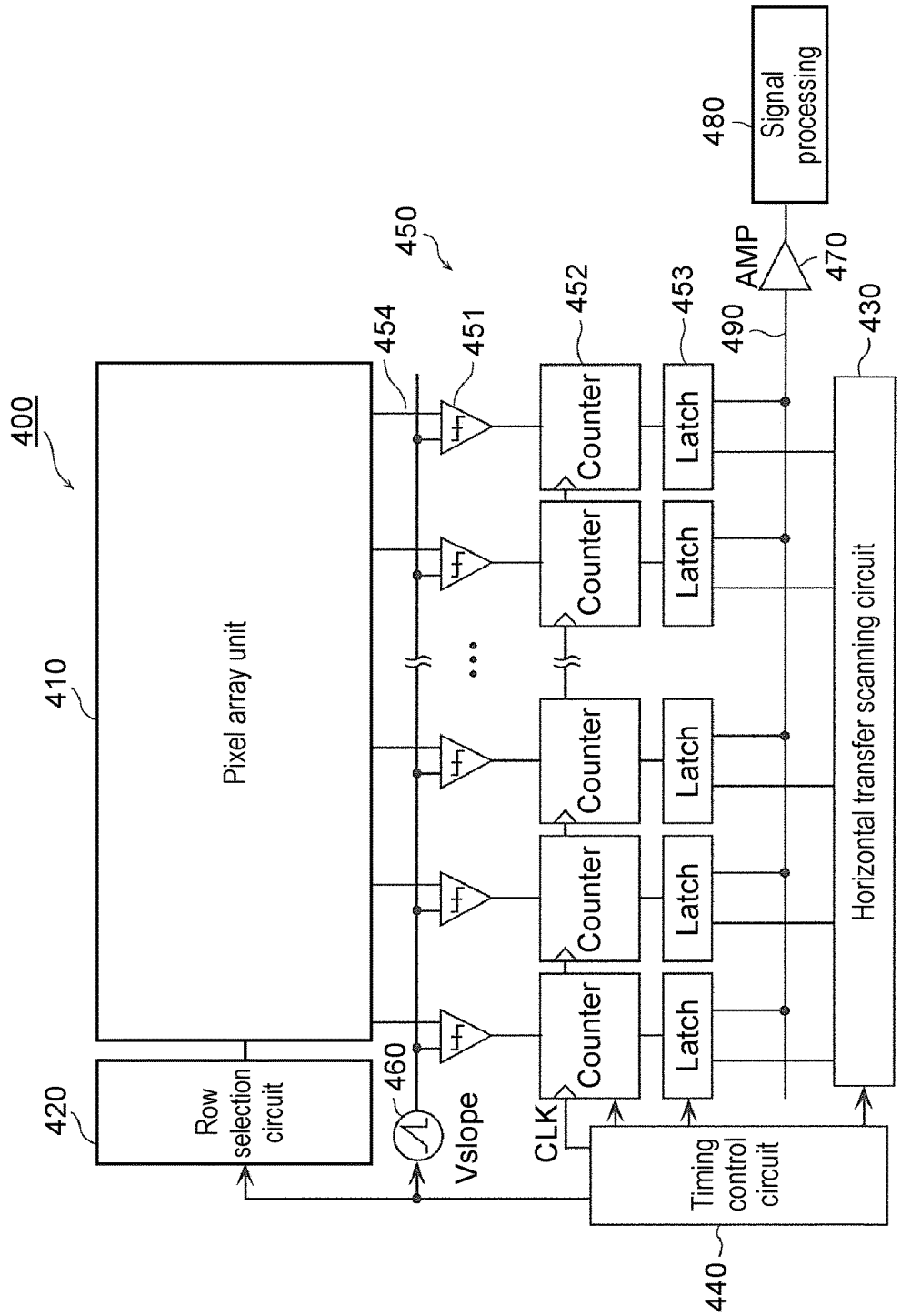
FIG. 12 is a view illustrating a configuration of a conventional solid-state imaging device.

For example, each of the plurality of unit cells included in the solid-state imaging devices according to the present disclosure may eliminate the selection transistor as illustrated in FIG. 11. FIG. 11 is a view illustrating another example (unit cell 100b) of a circuit configuration of unit cell 100 according to a modification of the exemplary embodiments.

Unit cell 100b illustrated in FIG. 11 is different from unit cell 100 illustrated in FIG. 2 in that selection transistor 105 is eliminated. In other words, unit cell 100b only includes transfer transistor 102, reset transistor 103, and reading transistor 104, whereas unit cell 100 serving as the control transistor includes transfer transistor 102, reset transistor 103, reading transistor 104, and selection transistor 105.

As described above, each of the plurality of unit cells 100b included in the solid-state imaging device according to this modification may eliminate selection transistor 105.

According to this structure, a photodiode area and an aperture ratio increase. Accordingly, unit cell 100b is allowed to receive a larger amount of light to increase sensitivity, for example.

According to the example discussed in the foregoing exemplary embodiments, an amplifier circuit is not provided between unit cell 100 and the AD conversion circuit (comparator 130, counter circuit 140, and memory circuit 160). However, an amplifier circuit may be provided between unit cell 100 and the AD conversion circuit in the solid-state imaging device of the present disclosure.

According to the example described in the exemplary embodiments herein, transistors T11 and T12 constituting a differential pair are NMOS transistors as illustrated in FIG. 3 and other figures. However, transistors T11 and T12 may be constituted by PMOS transistors. In this case, similar effects are produced by switching other transistors from PMOS to NMOS, and vice versa.

According to the solid-state imaging device of the present disclosure, pixels may be provided on a front surface of a semiconductor substrate, i.e., on the same surface as a surface where gate terminals and wirings of transistors are provided. Alternatively, the solid-state imaging device of the present disclosure may have a so-called a rear irradiation type image sensor (rear irradiation type solid-state imaging device) which forms pixels on a rear surface of a semiconductor substrate, i.e., on the opposite surface of the surface where gate terminals and wirings of transistors are provided.

A solid-state imaging device according to the present disclosure is capable of reducing deterioration of image quality (streaking) during imaging, and therefore is applicable to a CMOS solid-state imaging device, a digital still camera, a movie camera, a cellular phone equipped with a camera, a monitoring camera, a camera carried on a vehicle, a medical camera, or other various types of camera systems.

REFERENCE MARKS IN THE DRAWINGS 10,20,30,400 solid-state imaging device
100,100a,100b unit cell
101,101a,101b photodiode
102,102a,102b transfer transistor
103 transfer transistor
104 reading transistor
105 selection transistor
106 floating diffusion portion
110,454 vertical signal line
120 ramp signal generation circuit
121 ramp signal line
130,230,330,451 comparator
131,231 differential amplifier circuit
132 voltage generation circuit
140 counter circuit
150 data transfer switch
160 memory circuit
170 vertical selection circuit
180 horizontal selection circuit
190,440 timing control circuit
333 first switch
334 second switch
410 pixel array unit
420 row selection circuit
430 horizontal transfer scanning circuit
450 ADC group
452 counter
453 latch circuit
460 ramp signal generator
470 amplifier circuit
480 signal processing circuit
490 horizontal transfer line
T11,T12,T13,T14,T15,T16,T17,T18,T19 transistor
C11,C12,C13 capacitance

What is claimed is:

1. A solid-state imaging device comprising:
    a plurality of unit cells which are two-dimensionally disposed, and each of which generates a pixel signal corresponding to a light reception amount;
    a plurality of vertical signal lines each of which is provided for a corresponding column of the plurality of unit cells, and transfers the corresponding pixel signal;
    a plurality of comparators each of which is provided for a corresponding one of the plurality of vertical signal lines; and
    a ramp signal supply circuit that supplies a common ramp signal to the plurality of comparators,
    wherein
    each of the plurality of comparators includes
        a first differential amplifier circuit that includes a first transistor to which one of the ramp signal and the pixel signal is input through a gate of the first transistor, a second transistor to which the other of the ramp signal and the pixel signal is input through a gate of the second transistor, and an output terminal connected with a drain or a source of the second transistor, and outputting a signal corresponding to a difference between the ramp signal and the pixel signal, and
        a reduction circuit for reducing fluctuations of charge accumulated in a capacitance component of the first transistor.

2. The solid-state imaging device according to claim 1, wherein
    the ramp signal is input to the gate of the first transistor,
    the pixel signal is input to the gate of the second transistor, and
    the reduction circuit is a voltage generation circuit that generates voltage corresponding to current flowing in the first transistor, and supplies the generated voltage to the gate of the first transistor.

3. The solid-state imaging device according to claim 2, wherein the voltage generation circuit is a source follower circuit.

4. The solid-state imaging device according to claim 1, wherein
    the reduction circuit is a second differential amplifier circuit having a circuit configuration identical to a circuit configuration of the first differential amplifier circuit, the ramp signal is input to the gate of the first transistor of the first differential amplifier circuit, and to a gate of the second transistor of the second differential amplifier circuit, and the pixel signal is input to the gate of the second transistor of the first differential circuit, and to a gate of the first transistor of the second differential amplifier circuit.

5. The solid-state imaging device according to claim 1, wherein the reduction circuit includes a first switch capable of switching an input destination of the pixel signal to one of the first transistor and the second transistor, and a second switch capable of switching an input destination of the ramp signal to the other of the first transistor and the second transistor.

6. The solid-state imaging device according to claim 1, wherein each of the plurality of unit cells includes a reset transistor, a transfer transistor, a reading transistor, and a selection transistor.

7. The solid-state imaging device according to claim 1, wherein each of the plurality of unit cells does not include a selection transistor.

8. The solid-state imaging device according to claim 1, wherein each of the plurality of unit cells includes a plurality of light receiving elements, and at least one of a reset transistor, a reading transistor, and a selection transistor which are shared by the plurality of light receiving elements.

\* \* \* \* \*